(12) United States Patent
Grigoryan et al.

(10) Patent No.: US 11,023,310 B1
(45) Date of Patent: Jun. 1, 2021

(54) DETECTION OF ADDRESS ERRORS IN MEMORY DEVICES USING MULTI-SEGMENT ERROR DETECTION CODES

(71) Applicant: Synopsys, Inc., Mountain View, CA (US)

(72) Inventors: Hayk Grigoryan, Yerevan (AM); Grigor Tshagharyan, Yerevan (AM); Gurgen Harutyunyan, Yerevan (AM); Samvel Shoukourian, Yerevan (AM); Yervant Zorian, Mountain View, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 16/549,419

(22) Filed: Aug. 23, 2019

Related U.S. Application Data

(60) Provisional application No. 62/722,204, filed on Aug. 24, 2018.

(51) Int. Cl.
  *G06F 11/00* (2006.01)
  *G06F 11/10* (2006.01)
  *G11C 29/18* (2006.01)

(52) U.S. Cl.
  CPC ........ *G06F 11/1004* (2013.01); *G06F 11/102* (2013.01); *G11C 29/18* (2013.01); *G11C 2029/1802* (2013.01)

(58) Field of Classification Search
  None
  See application file for complete search history.

(56) References Cited

U.S. PATENT DOCUMENTS 7,293,221 B1 * 11/2007 Wong .................. G06F 11/1016
                                                   714/768
9,336,401 B2 * 5/2016 Dell ..................... G06F 21/602
(Continued)

OTHER PUBLICATIONS

S. M. Abbas, S. Lee, S. Baeg and S. Park, "An Efficient Multiple Cell Upsets Tolerant Content-Addressable Memory," in IEEE Transactions on Computers, vol. 63, No. 8, pp. 2094-2098, Aug. 2014, doi: 10.1109/TC.2013.90. (Year: 2014).*

*Primary Examiner* — Daniel F. McMahon
(74) *Attorney, Agent, or Firm* — Sterne, Kessler, Goldstein & Fox P.L.L.C.

(57) ABSTRACT

A system including a user interface, a memory, and a processor configured to perform operations including receiving memory scrambling information including address scrambling information and data scrambling information, and associating one or more address bus bits of a plurality of address bus bits with an address grouping of a plurality of address groupings based on the address scrambling information is disclosed. In an embodiment, the address grouping corresponds to at least one address segment of a plurality of address segments. The operations include determining an error correction code for the at least one address segment that includes one or more address check bits. The operations include generating a physical layout of memory components based on the memory scrambling information. The memory components include at least one of the plurality of address bus bits, and the one or more address check bits.

20 Claims, 6 Drawing Sheets

(56) References Cited

U.S. PATENT DOCUMENTS

| | | | | |
|---|---|---|---|---|
| 2004/0225943 A1* | 11/2004 | Brueggen | ............. | H03M 13/01 |
| | | | | 714/758 |
| 2014/0201597 A1* | 7/2014 | Hoekstra | ................. | G06F 11/10 |
| | | | | 714/764 |
| 2015/0318871 A1* | 11/2015 | Hoekstra | ............... | H03M 13/35 |
| | | | | 714/763 |
| 2016/0080002 A1* | 3/2016 | Ramaraju | ............... | G06F 3/064 |
| | | | | 714/764 |

\* cited by examiner

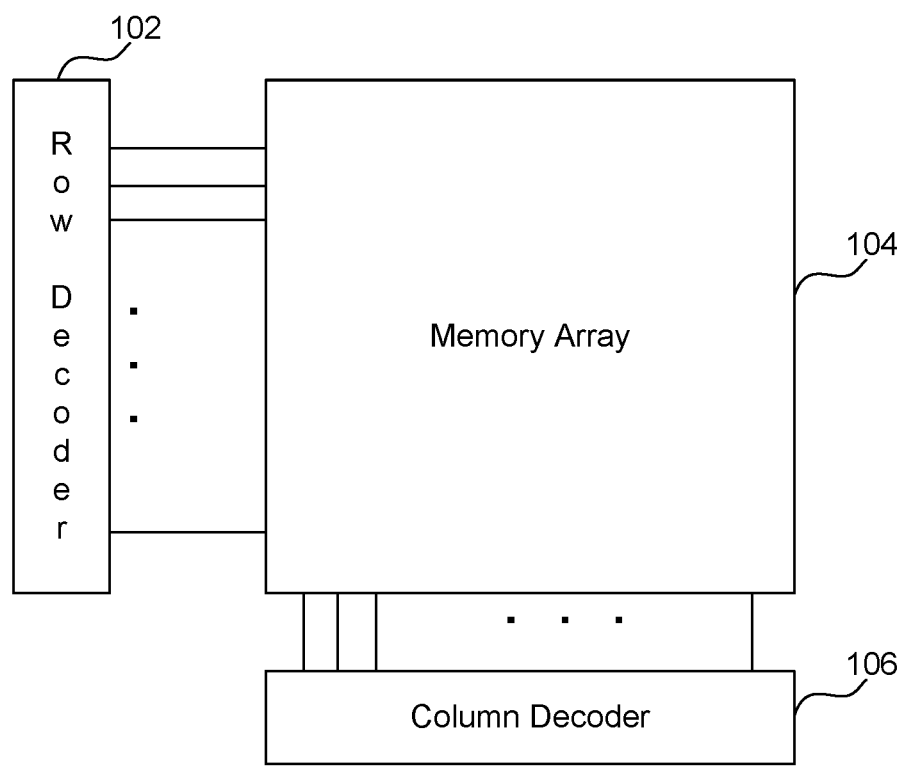
FIG. 1
(Conventional)

DETECTION OF ADDRESS ERRORS IN MEMORY DEVICES USING MULTI-SEGMENT ERROR DETECTION CODES

CROSS-REFERENCE TO RELATED APPLICATIONS

The present application claims priority under 35 U.S.C. § 119(e) to U.S. Provisional Patent Application No. 62/722,204, titled "Detection of Address Errors in Memory Devices Using Multi-Segment Error Detection Codes" and filed on Aug. 24, 2018, which is hereby incorporated by reference in its entirety for all purposes. This application also hereby incorporates by reference for all purposes U.S. Pat. No. 9,053,050 issued on Jun. 9, 2015.

COPYRIGHT NOTICE

The assignee of this patent document has no objection to the facsimile reproduction by anyone of the patent document itself, or of the patent application, as it appears in the files of the United States Patent and Trademark Office, but otherwise reserves all rights whatsoever in any included works of authorship protected by copyright.

SPECIFICATION—DISCLAIMERS

In the following Background, Summary, and Detailed Description, paragraph headings do not signify limitations. In these writings, the citation or identification of any publication signifies neither relevance nor status as prior art. Many paragraphs in this disclosure are common to multiple Synopsys patent specifications.

FIELD(S) OF TECHNOLOGY

The following information is solely for use in searching the prior art. This disclosure has significance in the field of electronics in general, including the following topics: detection and correction of soft error in memory array devices.

BACKGROUND

Memory is often susceptible to various environmental phenomena that can affect the integrity of the data stored in the memory. For example, cosmic rays can cause the states of bits stored in the memory to change, which can lead to data corruption. This is referenced as soft error in the electronics industry. Soft errors can affect not only memory data, but also affect other components of the memory structure such as an address decoder. Soft error in the address bus of the address decoder may result in addressing errors causing incorrect address being accessed for a read or write operation.

In modern technologies, the probability of soft errors affecting several address bus bits has increased. Conventional error detection coding schemes are not applicable to detect this kind of multi-bit errors, while some high reliability products (e.g., automotive) may require very high coverage. As described in U.S. Pat. No. 9,053,050, a technique is known that uses segmented error correction code (ECC) to increase the detection and correction ability of a given coding scheme. However, available solutions lack to take into consideration the structural information (memory scrambling) for grouping of address bus bits into segments which results into only sub-optimal error detection rate in memory device.

SUMMARY

This Summary is a prelude to the Detailed Description. This Summary, together with the independent Claims, signifies a brief writing about at least one claimed invention (which can be a discovery, see 35 USC 100(a); and see 35 USC 100(j)), for use in commerce that is enabled by the Specification and Drawings.

The claims signify a brief description of one or more of the innovations, embodiments, and/or examples found within this disclosure.

This disclosure describes a computerized system for detection of an error in a memory device. The computerized system may include a user interface, a memory configured to store operations, and one or more processors configured to perform the operations including receiving, via the user interface, memory scrambling information. The memory scrambling information may include address scrambling information and data scrambling information. The one or more processors are further configured to perform operations including associating one or more address bus bits of a plurality of address bus bits with an address grouping of a plurality of address groupings based on the address scrambling information. The address grouping may correspond to at least one address segment of a plurality of address segments. The operations may further include determining an error correction code for the at least one address segment. The error correction code for the at least one address segment may include one or more address check bits. The one or more processors are further configured to perform operations including associating one or more data bits of a plurality of data bits with a data grouping of a plurality of data groupings. The data grouping may correspond to at least one data segment of a plurality of data segments. The operations may further include determining an error correction code for the at least one data segment of the data segments. The error correction code for the at least one data segment may include one or more data check bits. The one or more processors are further configured to perform operations including generating a physical layout of memory components based on the memory scrambling information. The memory components may include at least one of the plurality of address bus bits, the plurality of data bits, the one or more data check bits, and the one or more address check bits.

This disclosure also describes a method for detection of an error in a memory device. The method may include receiving, at one or more computing devices, memory scrambling information including address scrambling information and data scrambling information. The method steps may be performed by the one or more computing devices, and may include associating one or more address bus bits of a plurality of address bus bits with an address grouping of a plurality of address groupings based on the address scrambling information. The address grouping may correspond to at least one address segment of a plurality of address segments. The method may further include determining an error correction code for the at least one address segment. The error correction code for the at least one address segment may include one or more address check bits. The method may also include associating one or more data bits of a plurality of data bits with a data grouping of a plurality of data groupings based on the data scrambling information.

The data grouping may correspond to at least one data segment of a plurality of data segments. The method may further include determining an error correction code for the at least one data segment of the plurality of data segments. The error correction code for the at least one data segment may include one or more data check bits. The method may further include generating a physical layout of memory components based on the memory scrambling information. The memory components may include at least one of the plurality of address bus bits, the plurality of data bits, the one or more data check bits, and the one or more address check bits.

This disclosure also describes a non-transitory computer-readable device having instructions stored thereon that, when executed by at least one computing device, causes the at least one computing device to perform operations including receiving memory scrambling information including address scrambling information and data scrambling information. The operations may include associating one or more address bus bits of a plurality of address bus bits with an address grouping of a plurality of address groupings based on the address scrambling information. The address grouping may correspond to at least one address segment of a plurality of address segments. The operations may further include determining an error correction code for the at least one address segment. The error correction code for the at least one address segment may include one or more address check bits. The operations may also include associating one or more data bits of a plurality of data bits with a data grouping of a plurality of data groupings based on the data scrambling information. The data grouping may correspond to at least one data segment of a plurality of data segments. The operations may further include determining an error correction code for the at least one data segment of the plurality of data segments. The error correction code for the at least one data segment may include one or more data check bits. The operations may further include generating a physical layout of memory components based on the memory scrambling information. The memory components may include at least one of the plurality of address bus bits, the plurality of data bits, the one or more data check bits, and the one or more address check bits.

This Summary does not completely signify the claimed inventions. This Summary (as well as the Abstract) neither signifies essential elements of, nor limits the scope of, the claimed inventions enabled by the Specification and Figures.

DRAWINGS

The following Detailed Description, Figures, and Claims signify the uses and advantages of the claimed inventions, and their embodiments. All of the Figures are used only to provide knowledge and understanding and do not limit the scope of the claimed inventions and their embodiments. Such Figures are not necessarily drawn to scale.

Similar components or features used in the Figures can have the same, or similar, reference signs in the form of labels (such as alphanumeric symbols, e.g., reference numerals), and can signify a similar or equivalent use. Further, various components of the same type can be distinguished by following the reference label by a dash and a second label that distinguishes among the similar components. If only the first reference label is used in the Specification, its use applies to any similar component having the same first reference label irrespective of the second reference label. A brief description of the Figures is below.

FIG. 1 illustrates a memory structure;

Figure 2:
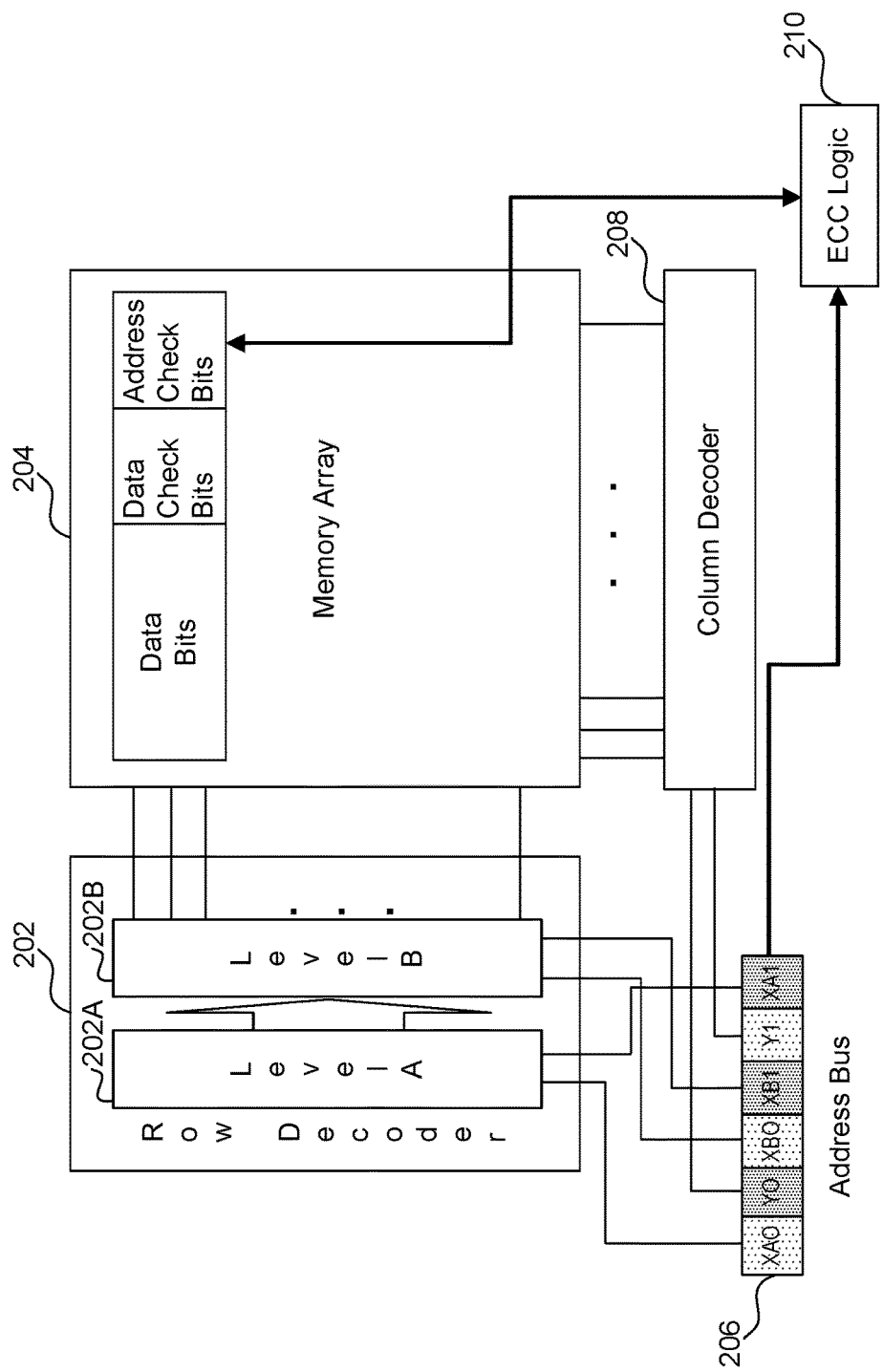
FIG. 2 illustrates a memory structure with address bus bits segments, according to an exemplary embodiment of the present disclosure.

In the Figures, reference signs can be omitted as is consistent with accepted engineering practice; however, a skilled person will understand that the illustrated components are readily understood when viewed in the context of the illustration as a whole and the accompanying disclosure describing such various figures.

DETAILED DESCRIPTION

The Figures and Detailed Description signify, only to provide knowledge and understanding, the claimed inventions. To minimize the length of the Detailed Description, while various features, structures or characteristics can be described together in a single embodiment, they also can be used in other embodiments without being written about. Variations of any of these elements, and modules, processes, machines, systems, manufactures or compositions disclosed by such embodiments and/or examples are easily used in commerce. The Figures and Detailed Description also can signify, implicitly or explicitly, advantages and improvements of the claimed inventions and their embodiments for use in commerce.

In the Figures and Detailed Description, numerous specific details can be described to enable at least one embodiment of the claimed inventions. Any embodiment disclosed herein signifies a tangible form of a claim invention. To not obscure the significance of the embodiments and/or examples in this Detailed Description, some elements that are known to a skilled person can be combined together for presentation and for illustration purposes and not be described in detail. To not obscure the significance of these embodiments and/or examples, some well-known processes, machines, systems, manufactures or compositions are not written about in detail. However, a skilled person can use these embodiments and/or examples in commerce without these specific details or their equivalents. Thus, the Detailed Description focuses on enabling the distinctive elements of the claimed inventions and exemplary embodiments. Where this Detailed Description refers to some elements in the singular tense, more than one element can be depicted in the Figures and like elements are labeled with like numerals.

Detailed Description—Exemplary Memory Structure

FIG. 1 is an exemplary memory structure that may include memory array. The user interface may include memory array 104, a row decoder 102, and a column decoder 106. The memory structure shown in FIG. 1 may be any type of memory, for example, a random access memory (RAM), a read only memory (ROM), etc. The RAM may be either static RAM (SRAM) or dynamic RAM (DRAM). The memory array 104 may be multiple bit memory elements, which may be of 8 bits, 16 bits, 32 bits, and/or 64 bits, depending on the architecture. By way of non-limiting example, the memory array 104 may store $2^n$ words of $2^m$ bits each. Accordingly, the memory array 102 may be a matrix, where N may represent a number of rows of the memory array 102, and M may represent number of columns of the memory structure 102. A specific memory element at a specific row and a column position may be referenced by using a specific binary address. The specific binary address may be selected using a row decoder 102 and a column decoder 106.

The row decoder 102 based on input at the address bus bits may select a memory element of a particular row, and the column decoder 106 based on the input at the address bus bits may select a specific word or section of the selected row. The number of address bus bits required at the row decoder 102 may be calculated or determined as $\log_2(N)$, and the number of address bus bits required at the column decoder may similarly be calculated or determined as $\log_2(M)$, where N may represent number of rows and M may represent number sections/words per each row. Thus, for a memory array of 1024×16 bits, to read a word stored in the memory array may require address bus bits of 10 bits as input to the row decoder 102 and address bus bits of 4 bits as input to the column decoder 106.

The memory structure shown in FIG. 1 may have other components such as sense amplifier(s), row buffer(s), etc., but are not shown, as they are not of specific importance for the discussion of detection of soft error in the address bus bits of the input of the row decoder and the column decoder. The row decoder and the column decoder may be implemented using NAND gate or NOR gate. The row decoder may be implemented as hierarchical decoders or cascaded decoders. The column decoder may be implemented using a MUX.

Detailed Description—Exemplary Memory Structure with Address Bus Bits Segments

FIG. 2 illustrates a memory structure with address bus bits segments, according to an exemplary embodiment of the present disclosure. A memory array 204 that stores data bits 204a, data check bits 204b, and address check bits 204c is show in FIG. 2. As described above, particular memory element, i.e., data word, may be referenced by a specific binary address. The data in the memory array 204 at the specific binary address may be selected based on input address bus bits at the row decoder 202 and a column decoder 208.

As shown in FIG. 2, an exemplary memory structure has four address bus bits for the row decoder 202 and two address bus bits for the column decoder 208. The four address bus bits for the row decoder go to cascaded row decoders 202a and 202b for level A and level B respectively. As shown in FIG. 2, two address bus bits XA0 and XA1 are input to the row decoder 202a, and two address bus bits XB0 and XB1 are input to the row decoder 202b. While the decoder 202 is shown as cascaded or hierarchical decoder, the row decoder 202 may be a row decoder as shown in FIG. 1 and may receive four address bus bits as input at the row decoder 202. Two address bus bits Y0 and Y1 are address bus bits as input to the column decoder 208.

As known to a person skilled in the art, memory scrambling information may specify the different scrambling techniques implemented in the memory. The memory scrambling information may additionally specify the parameters, structures, and/or other data needed to implement the scrambling techniques. The memory scrambling information may include data scrambling information and address scrambling information. The user may also specify multi-bit upset size requirement and masked write segmentation requirement via the user interface. The masked write segmentation requirement can indicate the minimum number of segments in which a data word of the memory must be divided. The multi-bit upset size requirement can indicate a minimum distance that must separate any 2 bits of the same data word segment.

Based on the data scrambling information, a mapping between the logical structure and physical layout of the memory structure components may be determined. Based on mapping, a number of distances for a number of different logical pairs of one or more bits of the data in the memory or data groupings may be calculated. After determining the distances, a specific segmentation value may be selected, where the segmentation value is greater than a defined masked write segmentation value. As described herein, a segmentation value may refer to a number of segments in which each data grouping of a memory may be divided for a multi-segment SEC coding scheme.

Similarly, based on the address scrambling information, a mapping between the logical structure and physical layout of the address bus bits may be determined. Based on the mapping between the logical structure and physical layout of the address bus bits, a number of distances for a number of different logical pairs of one or more address bus bits or address groupings of one or more address bus bits may be calculated. After determining the distances, a specific segmentation value may be selected, where the segmentation value may refer to a number of segments in which each address grouping may be divided for a multi-segment SEC coding scheme.

As known to a person skilled in the art, soft errors in the memory may occur both in the memory array, which stores the actual memory data, and in the periphery, i.e., a row decoder 102 and a column decoder 106. To detect soft errors in the memory, error correction scheme may be employed. The error correction scheme may be single error correcting (SEC) codes or multi-bit error correcting (MEC) codes.

In error correction scheme, check bits may be added for each address segment and/or data segment. The added check bits may be used to facilitate the detection and correction of errors. In schemes that employ SEC codes, only single-bit errors are typically correctable. These same schemes are not normally able to handle multi-bit upsets. In general, a multi-bit upset refers to the corruption of a plurality of bits in a data word or address bus bits. For example, a data word may contain 32 bits. A multi-bit upset would occur if, for example, 3 of the 32 bits become corrupted. Similarly, a multi-bit upset would occur if, for example, 2 of the 4 address bus bits as input to the row decoder 202 become corrupted. As used herein, the size of a multi-bit upset refers to the maximum distance between any 2 bits, where a single environmental event (e.g., a cosmic ray) can lead to the corruption of both bits.

Traditionally, ECC (Error Correcting Code) is used for memory array soft errors, which allows, depending on the code used (e.g., Hamming code), to detect and/or correct errors in one or more bits. Similarly, for detecting soft errors in the address bus bits as input to the row decoder 202 and/or the column decoder 208, ECC may be used. To use ECC for the address bus bits as input to the row decoder 202 and/or the column decoder 208, during memory write access, a checksum may be calculated from the address and stored along with the corresponding data word. During memory read access, this stored checksum may be used to validate the accessed address. This allows detecting whether the correct address is being accessed and whether another write operation to a different address has incorrectly modified the data at the current address. As shown in FIG. 2, ECC logic 210 may generate checksum for the address bus bits that may include the address bus bits as input to the row decoder 202 and the column decoder 208. The ECC logic 210 may generate error correcting code using Hamming code, an odd bit parity check, an even bit parity check, or a cyclic redundancy check, etc.

Though the ECC logic 210 may also generate error correcting code based on a code that detects errors in multiple bits (e.g. BCH code), this will incur significant hardware area and access time overhead. Accordingly, in today's nanoscale technologies, a single upset event (e.g. an alpha particle) may affect multiple consecutive bits. However, if the consecutive address bits are in multiple segments, where neighboring bits are assigned to different segments, a single upset event may affect only a single bit of a segment.

Figure 3:
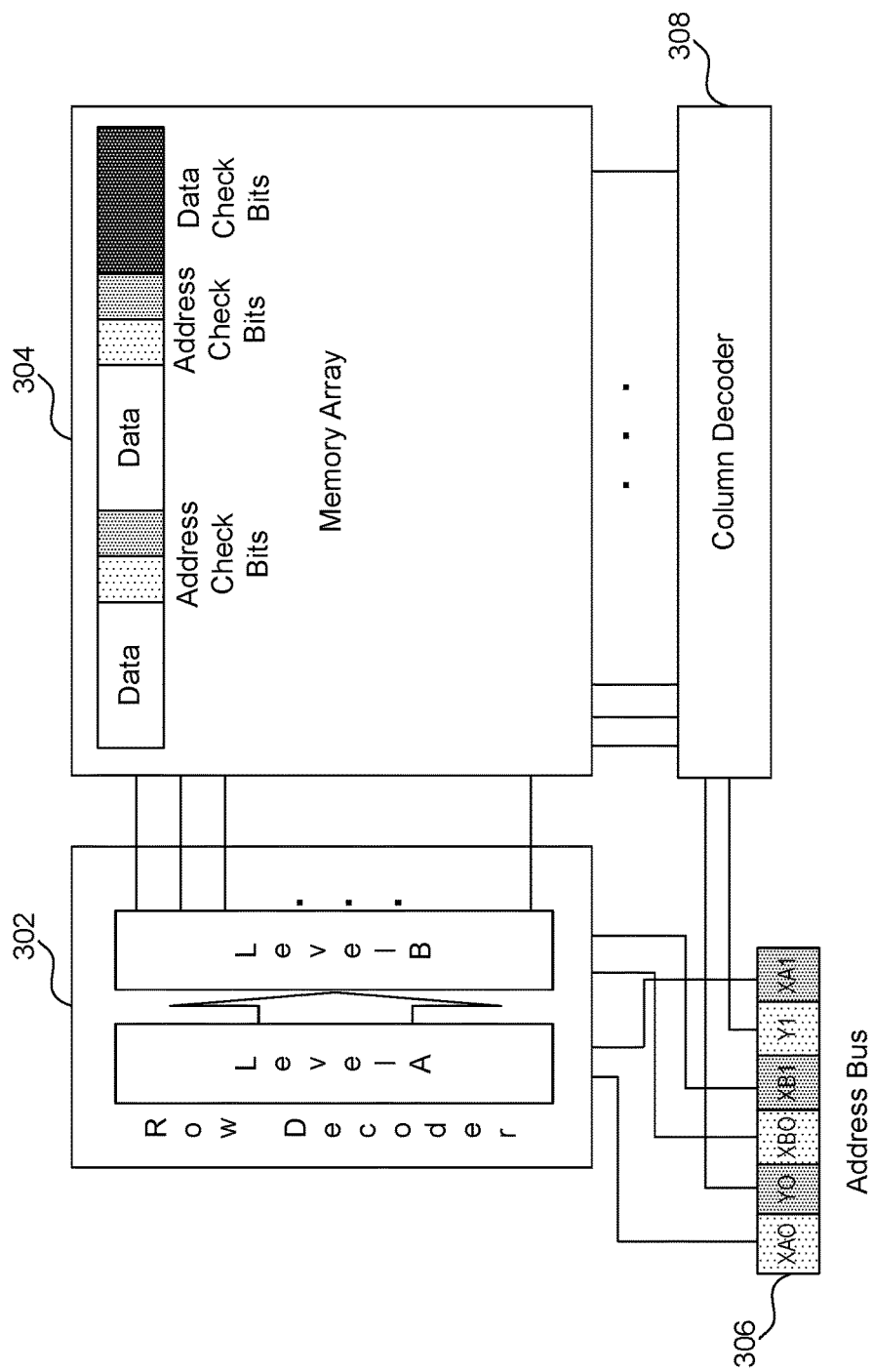
FIG. 3 illustrates a memory structure, according to an exemplary embodiment of the present disclosure.

Accordingly, information of physical proximity of bits in the address bus and whether they are used as inputs to the same decoder element may be required. This information is available in the address scrambling information and/or data scrambling information in the memory scrambling information. Based on the physical proximity of bits, the bits corresponding a single segment may be placed as far away from each other as possible, in order to minimize the probability of them being affected at the same time. The physical layout of the memory array needed to accomplish this may be available from the memory scrambling information. FIG. 3 below illustrates an example of how the grouping and the bit placement in the memory array might look like, according to an exemplary embodiment of the present disclosure.

Detailed Description—Exemplary Memory Structure with Address Bus Bits Segments

FIG. 3 illustrates a memory structure, according to an exemplary embodiment of the present disclosure. Specifically, FIG. 3 illustrates an example of how the grouping and the bit placement in the memory array may be determined based on the memory scrambling information. FIG. 3, like FIG. 2, shows memory array 304, which may be similar to memory array 204 shown in FIG. 2. Row decoder 302 may be similar to the row decoder 202, and therefore is not being described again. Similarly, the column decoder 308 may be similar to the column decoder 208 shown and described with reference to FIG. 2 above. Address bus bits to the row decoder 302 and the column decoder 308 are shown as 306. By way of non-limiting example, and for simplicity, the address bus bits 306 have only six bits, XA0-1, XB0-1, and Y0-1. Further, as described above, the row decoder 302 may be a cascaded or hierarchical row decoder. Accordingly, address bus bits XA0 and XA1 may be input to the row decoder of level A, and XB0 and XB1 may be input to the row decoder of level B.

As described above, in memory devices based on today's nanoscale technologies, a single upset event (e.g. an alpha particle) may affect multiple consecutive bits, which may be consecutive address bits such as XA0 and XA1 or XB0 and XB1. However, if the consecutive address bits are in multiple segments, where neighboring bits are assigned to different segments, a single upset event may affect only a single bit of a segment. Accordingly, single error correction codes may be used to detect and correct an error. Thereby, multi-bit error correction codes may not be required that requires substantial additional hardware and computing overhead.

As described above, therefore, address bus bits XA0 and XA1, which are consecutive address bus bits, are placed in different segments as can be seen from the different shading. Similarly, address bus bits XB0 and XB1, and Y0 and Y1 are also placed in different segments as can be seen from the different shading. As shown in FIG. 3, two address segments are shown, in which, a first address segment, by way of non-limiting example, may include address bus bits XA0, XB0, and Y1, and a second address segment, by way of non-limiting example, may include address bus bits XA1, XB1, and Y0.

Next, single bit error correction code scheme may be employed to generate an error correction code for an address segment. The error correction code generated for the address segment may include one or more address check bits. Since, a single upset event may also impact the consecutive address check bits of the error correction code for the address segment, as described above, based on the memory scrambling information that may include address scrambling information and data scrambling information, one or more address check bits for the error correction code of the address segment may be placed in a different segment to store in the memory array 304 with the data. As known to a person skilled in the art, the address scrambling information may include one or more of structural properties of a row decoder, structural properties of a column decoder, structural properties of cascaded or hierarchical decoders, and wire proximities, and the data scrambling information may include at least one of input-output (I/O) cell scrambling, column scrambling, column twisting, and a strap distribution.

Based on the address and data scrambling information as received in the memory scrambling information, via a user interface of the computer system, a plurality of segments of one or more address check bits of the error correction code of the address segment may be generated or determined. In addition, as shown in FIG. 3, a plurality of segments of address check bits may be placed as far away as possible to avoid a single upset event corrupting multiple bits of the error correction of the address segment.

While not shown in FIG. 3, the inventors also contemplated that data bits may also be placed in a plurality of data segments, and an error correction code for the data segment may be generated. Accordingly, U.S. Pat. No. 9,053,050 issued on Jun. 9, 2015 is hereby incorporated by reference for all purposes. The error correction code for the data segment may also include one or more data check bits. The one or more data check bits of the data segment may be assigned a different segment similar to the one or more address check bits are assigned a different segment. The segments comprising one or more data check bits may be placed as far away as possible to avoid single upset event to corrupt multiple bits of the error correct code of the data segment.

Accordingly, based on the multi-bit upset size requirement and memory scrambling information including address scrambling information and data scrambling information, a physical layout may be generated for the memory components. The memory components may include at least one of the plurality of address bus bits, the plurality of data bits, the one or more address check bits, and the one or more data check bits.

Detailed Description—Exemplary Method Flow Chart

Figure 4:
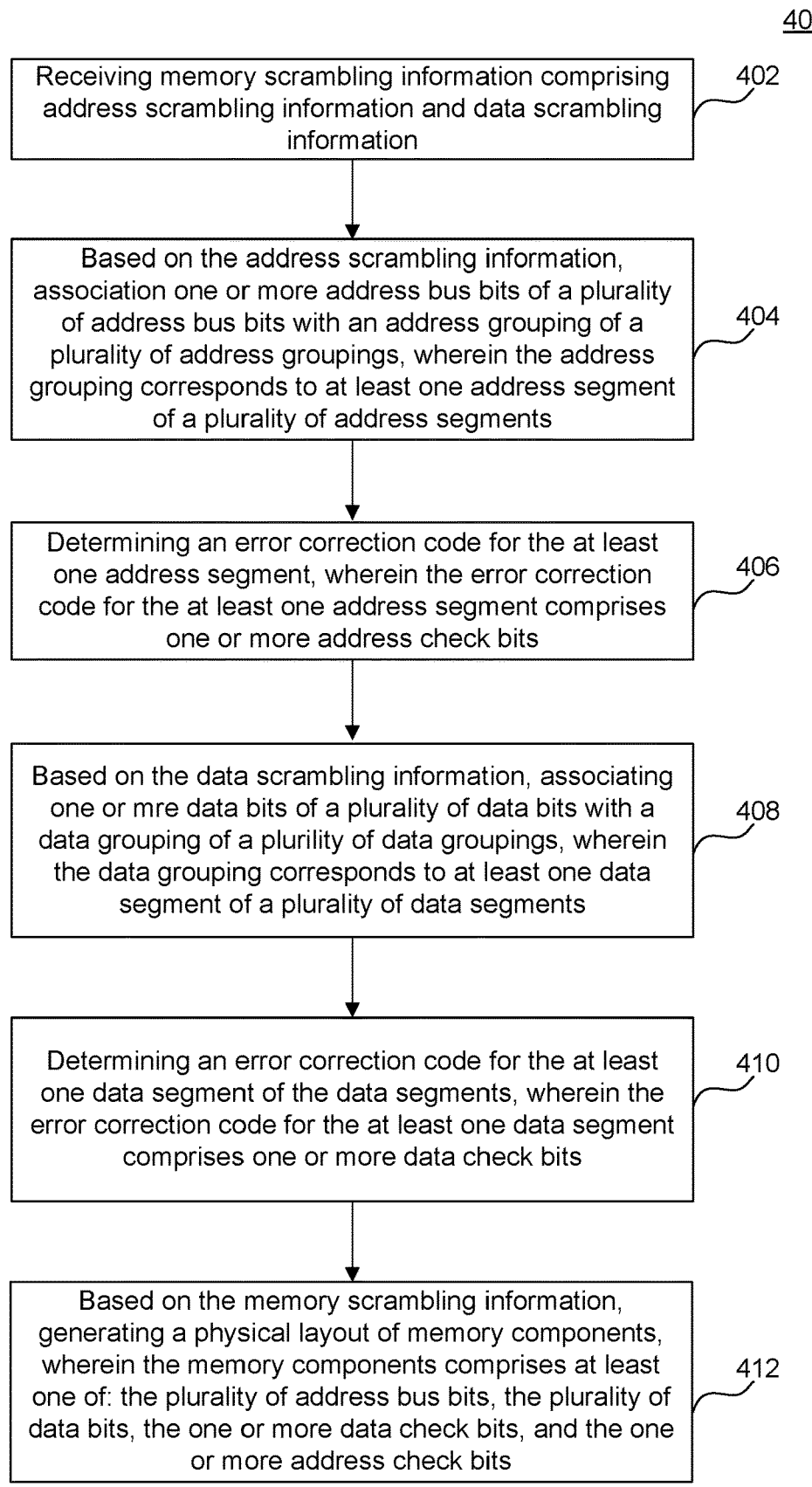
FIG. 4 illustrates a flow chart, according to an exemplary embodiment of the present disclosure.

FIG. 4 illustrates a flow chart, according to an exemplary embodiment of the present disclosure. As shown in FIG. 4, the method flow chart 400 starts at step 402. At step 402, one or more computing devices, may receive memory scrambling information via a user interface. The user interface may include a graphical user interface (GUI), and a command line interface (CLI). The user interface maybe an interface over a TCP/IP, a UDP, and/or an FTP protocol. The user interface maybe implemented over a secure network, for example, using an IPSec, and/or SSH. The memory scrambling information, as described above, may include address scrambling information and data scrambling information. By way of non-limiting example, the address scrambling information may include structural properties of a row decoder, structural properties of a column decoder, structural properties of cascaded decoders or hierarchical decoders, and/or wire proximities. By way of non-limiting example, data scrambling information may include input-output (IO) cell scrambling, column scrambling, column twisting, and a strap distribution.

At step 404, based on the received memory scrambling information, the method may associate one or more address bus bits with an address grouping. By way of non-limiting example, as described above, the address bus to a row decoder and/or a column decoder may be of more than one bit. Based on the address scrambling information that specifies structural information of the row decoder, the column decoder, the cascaded decoders, and/or the wire proximities, the address bus bits may be associated with different groups. By way of non-limiting example, as described above, with reference to FIG. 3, address bus bits XA0, XA1, XB0, XB1, Y0, and Y1 may be assigned address grouping. As shown in the example of FIG. 3, address bus bits XA0, XB0, and Y1 are assigned to a first address grouping, and address bus bits XA1, XB1, and Y0 are assigned to a second address grouping. A person skilled in art would recognized that there may be more than six address bus bits depending on the architecture and memory array size, and accordingly actual number of address groupings may be more than two. Further, to enable detection of soft error caused by a single upset event affecting multiple consecutive bits, the address grouping may correspond to a plurality of address segments. By way of non-limiting example, as shown in FIG. 3, the first and the second address grouping each corresponds to two address segments.

At step 406, as described above, an error detection code for the address segment may be determined. As described above, various error correction code schemes may be employed. The multi-bit error correction code schemes may be able to detect and correct an error in multiple bits of the address segment. However, multi-bit error correction code schemes such as Bose-Chaudhuri-Hocquenghem (BCH) codes may requires substantial additional hardware and computing overhead in comparison with single error correction codes. Further, because the address bus bits from a single address grouping are allocated different address segments, and each address segment is as far away as possible based on the address scrambling information, a single error correction code may be used to detect and correct a soft error in multiple bits of the address segment without use of multi-bit error correction code schemes. The single error correction code for the address segment and/or the data segment may include Hamming's code, an even parity bit, an odd parity bit, and/or a cyclic redundancy check (CRC).

At step 408, as described above and using a similar technique as described at step 404, one or more data bits of a plurality of data bits of a data element may be assigned different data grouping based on data scrambling information. The data grouping may correspond to at least one data segment of a plurality of data segments, so that a single multi-bit upset event may not corrupt consecutive bits of the address grouping for the reasons described above.

At step 410, an error correction code for the data segment may be calculated or determined. As described above, there may be more than one data segment, and the error correction code for the data segment may include one or more data check bits.

At step 412, based on the memory scrambling information, a physical layout may be generated of memory components. The memory components, as described above, are the plurality of address bus bits, the plurality of data bits, the one or more data check bits, and the one or more address check bits. Depending on the memory scrambling information including the address scrambling information and the data scrambling information, there may be many different ways, the address bus bits, the data bits, the address check bits, and the data check bits may be assigned address grouping and/or data grouping, and the address grouping and the data grouping may be assigned address segments and data segments respectively. While generating the physical layout of the memory components, based on the multi-bit upset size requirement, segments are placed to maximize physical distance between two bits of the error correction code for the address segment and/or the error correction code for the data segment.

Detailed Description—Technology Support from Data/Instructions to Processors/Programs Data and Information. While 'data' and 'information' often are used interchangeably (e.g., 'data processing' and 'information processing'), the term 'datum' (plural 'data') typically signifies a representation of the value of a measurement of a physical quantity (e.g., the current in a wire), or the answer to a question (e.g., "yes" or "no"), while the term 'information' typically signifies a structured set of data (often times signified by 'data structure'). A specified data structure is used to structure an electronic device to be used as a specific machine as an article of manufacture (see In re Lowry, 32 F.3d 1579 [CAFC, 1994]). Data and information are physical, for example binary data (a 'bit', usually signified with '0' and '1') enabled with two different levels of voltage in a circuit. For example, data can be enabled as an electrical, magnetic, optical or acoustical signal; a quantum state such as spin that enables a 'qubit'; or a physical state of an atom or molecule. All such data and information, when enabled, are stored, accessed, transferred, combined, compared, or otherwise acted upon, actions that require energy.

As used herein, the term 'process' signifies an unnatural sequence of physical actions and/or transformations (both also referred to as 'operations' or 'steps') to produce at least one result. The actions and transformations are technical applications of one or more natural laws of science or unnatural laws of technology. The actions and transformations often change the physical state of a machine, of structures of data and information, or of a composition of matter. Two or more actions can occur at about the same time, or one action can occur before or after another action, if they produce the same result. A description of the physical actions and/or transformations that comprise a process are often signified with a set of gerund phrases (or their semantic equivalents) that are typically preceded with the signifier 'the steps of' (e.g., "a process comprising the steps of measuring, transforming, partitioning and then distributing . . . "). The signifiers 'algorithm', 'method', 'procedure', '(sub)routine', 'protocol', 'recipe', and 'technique' often are used interchangeably with 'process', and 35 U.S.C. 100 defines a "method" as one type of process that is, by statutory law, always patentable under 35 U.S.C. 101. Many forms of knowledge, learning, skills and styles are authored, structured, and enabled—objectively—as processes—e.g., knowledge and learning as functions in knowledge programming languages. As used herein, the term 'rule' signifies a process with at least one conditional test (signified, e.g., by 'IF test THEN process'). As used herein, the term 'thread' signifies a sequence of operations or instructions that comprise a subset of an entire process. A process can be partitioned into multiple threads that can be used at or about at the same time.

As used herein, the term 'component' (also signified by 'part', and typically signified by 'element' when described in a patent text or diagram) signifies a physical object that is used to enable a process in combination with other components. For example, electronic components are used in processes that affect the physical state of one or more electromagnetic or quantum particles/waves (e.g., electrons, photons) or quasiparticles (e.g., electron holes, phonons, magnetic domains) and their associated fields or signals. Electronic components have at least two connection points to which are attached 'leads', typically a conductive wire or an optical fiber, with one end attached to the component and the other end attached to another component, typically as part of a circuit with current flows. There are at least three types of electrical components: passive, active and electromechanical. Passive electronic components typically do not introduce energy into a circuit—such components include resistors, memristors, capacitors, magnetic inductors, crystals, Josephson junctions, transducers, sensors, antennas, waveguides, etc. Active electronic components require a source of energy and can inject energy into a circuit—such components include semiconductors (e.g., diodes, transistors, optoelectronic devices), vacuum tubes, batteries, power supplies, displays (e.g., LEDs, LCDs, lamps, CRTs, plasma displays). Electromechanical components affect current flow using mechanical forces and structures—such components include switches, relays, protection devices (e.g., fuses, circuit breakers), heat sinks, fans, cables, wires, terminals, connectors and printed circuit boards. As used herein, the term 'netlist' is a specification of the components comprising an electric circuit, and electrical connections between the components. The programming language for the SPICE circuit simulation program is often used to specify a netlist. In the context of circuit design, the term 'instance' signifies each time a component is specified in a netlist.

One of the most important components as goods in commerce is the integrated circuit, and its res of abstractions. As used herein, the term 'integrated circuit' signifies a set of connected electronic components on a small substrate (thus the use of the signifier 'chip') of semiconductor material, such as silicon or gallium arsenide, with components fabricated on one or more layers. Other signifiers for 'integrated circuit' include 'monolithic integrated circuit', 'IC', 'chip', 'microchip' and 'System on Chip' ('SoC'). Examples of types of integrated circuits include gate/logic arrays, processors, memories, interface chips, power controllers, and operational amplifiers. The term 'cell' as used in electronic circuit design signifies a specification of one or more components, for example, a set of transistors that are connected to function as a logic gate. Cells are usually stored in a database, to be accessed by circuit designers and design processes.

As used herein, the term 'module' signifies a tangible structure for acting on data and information. For example, the term 'module' can signify a process that transforms data and information, for example, a process comprising a computer program. The term 'module' also can signify one or more interconnected electronic components, such as digital logic devices. A process comprising a module, if specified in a programming language, such as System C or Verilog, also can be transformed into a specification for a structure of electronic components that transform data and information that produce the same result as the process. This last sentence follows from a modified Church-Turing thesis, which is simply expressed as "Whatever can be transformed by a (patentable) process and a processor, can be transformed by a (patentable) equivalent set of modules.", as opposed to the doublethink of deleting only one of the "(patentable)".

A module is permanently structured (e.g., circuits with unalterable connections), temporarily structured (e.g., circuits or processes that are alterable with sets of data), or a combination of the two forms of structuring. Permanently structured modules can be manufactured, for example, using Application Specific Integrated Circuits ('ASICs') such as Arithmetic Logic Units ('ALUs'), Programmable Logic Arrays ('PLAs'), or Read Only Memories ('ROMs'), all of which are typically structured during manufacturing. For example, a permanently structured module can comprise an integrated circuit. Temporarily structured modules can be manufactured, for example, using Field Programmable Gate Arrays (FPGAs—for example, sold by Xilink or Intel's Altera), Random Access Memories (RAMs) or microprocessors. For example, data and information is transformed using data as an address in RAM or ROM memory that stores output data and information. One can embed temporarily structured modules in permanently structured modules (for example, a FPGA embedded into an ASIC).

Modules that are temporarily structured can be structured during multiple time periods. For example, a processor comprising one or more modules has its modules first structured by a manufacturer at a factory and then further structured by a user when used in commerce. The processor can comprise a set of one or more modules during a first time period, and then be restructured to comprise a different set of one or modules during a second time period. The decision to manufacture or implement a module in a permanently structured form, in a temporarily structured form, or in a combination of the two forms, depends on issues of commerce such as cost, time considerations, resource constraints, tariffs, maintenance needs, national intellectual property laws, and/or specific design goals. How a module is used is mostly independent of the physical form in which it is manufactured or enabled. This last sentence also follows from the modified Church-Turing thesis.

As used herein, the term 'processor' signifies a tangible data and information processing machine for use in commerce that physically transforms, transfers, and/or transmits data and information, using at least one process. A processor consists of one or more modules (e.g., a central processing unit, 'CPU', an input/output ('I/O') controller, a memory controller, a network controller, and other modules). The term 'processor' can signify one or more processors, or one or more processors with multiple computational cores/CPUs, specialized processors (for example, graphics processors or signal processors), and their combinations. Where two or more processors interact, one or more of the processors can be remotely located. Where the term 'processor' is used in another context, such as a 'chemical processor', it will be signified and defined in that context.

The processor can comprise, for example, digital logic circuitry (for example, a binary logic gate), and/or analog circuitry (for example, an operational amplifier). The processor also can use optical signal processing, DNA transformations or quantum operations, microfluidic logic processing, or a combination of technologies, such as an optoelectronic processor. For data and information structured with binary data, any processor that can transform data and information using the AND, OR and NOT logical operations (and their derivatives, such as the NAND, NOR, and XOR operations) also can transform data and information using any function of Boolean logic. A processor such as an analog processor, such as an artificial neural network, also can transform data and information. No scientific evidence exists that any of these technological processors are processing, storing and retrieving data and information, using any process or structure equivalent to the bioelectric structures and processes of the human brain.

The one or more processors also can use a process in a 'cloud computing' environment, where time and resources of multiple remote computers are shared by multiple users or processors communicating with the computers. For example, a group of processors can use at least one process available at a distributed or remote system, these processors using a communications network (e.g., the Internet, or an Ethernet) and using one or more specified interfaces (e.g., an application program interface ('API') that signifies functions and data structures to communicate with the remote process).

As used herein, the term 'computer' and 'computer system' (further defined below) includes at least one processor that, for example, performs operations on data and information such as (but not limited to) the AND, OR and NOT logical operations using electronic gates that can comprise transistors, with the addition of memory (for example, memory structured with flip-flops using the NOT-AND or NOT-OR operation). Such a processor is Turing-complete and computationally universal. A computer can comprise a simple structure, for example, comprising an I/O module, a CPU, and a memory that performs, for example, the process of inputting a signal, transforming the signal, and outputting the signal with no human intervention.

As used herein, the term 'programming language' signifies a structured grammar for specifying sets of operations and data for use by modules, processors and computers. Programming languages include assembler instructions, instruction-set-architecture instructions, machine instructions, machine dependent instructions, microcode, firmware instructions, state-setting data, or either source code or object code written in any combination of one or more higher level languages, for example, the C programming language and similar general programming languages (such as Fortran, Basic, Javascript, PHP, Python, C++), knowledge programming languages (such as Lisp, Smalltalk, Prolog, or CycL), electronic structure programming languages (such as VHDL, Verilog, SPICE or SystemC), text programming languages (such as SGML, HTML, or XML), or audiovisual programming languages (such as SVG, MathML, X3D/VRML, or MIDI), and any future equivalent programming languages. As used herein, the term 'source code' signifies a set of instructions and data specified in text form using a programming language. A large amount of source code for use in enabling any of the claimed inventions is available on the Internet, such as from a source code library such as Github.

As used herein, the term 'program' (also referred to as an 'application program') signifies one or more processes and data structures that structure a module, processor or computer to be used as a "specific machine" (see In re *Alappat*, 33 F3d 1526 [CAFC, 1991]). One use of a program is to structure one or more computers, for example, standalone, client or server computers, or one or more modules, or systems of one or more such computers or modules. As used herein, the term 'computer application' signifies a program that enables a specific use, for example, to enable text processing operations, or to encrypt a set of data. As used herein, the term 'firmware' signifies a type of program that typically structures a processor or a computer, where the firmware is smaller in size than a typical application program, and is typically not very accessible to or modifiable by the user of a computer. Computer programs and firmware are often specified using source code written in a programming language, such as C. Modules, circuits, processors, programs, and computers can be specified at multiple levels of abstraction, for example, using the SystemC programming language, and have value as products in commerce as taxable goods under the Uniform Commercial Code (see U.C.C. Article 2, Part 1).

A program is transferred into one or more memories of the computer or computer system from a data and information device or storage system. A computer system typically has a device for reading storage media that is used to transfer the program, and/or has an interface device that receives the program over a network. This process is discussed in the General Computer Explanation section.

Detailed Description—Technology Support General Computer Explanation

Figure 6A:
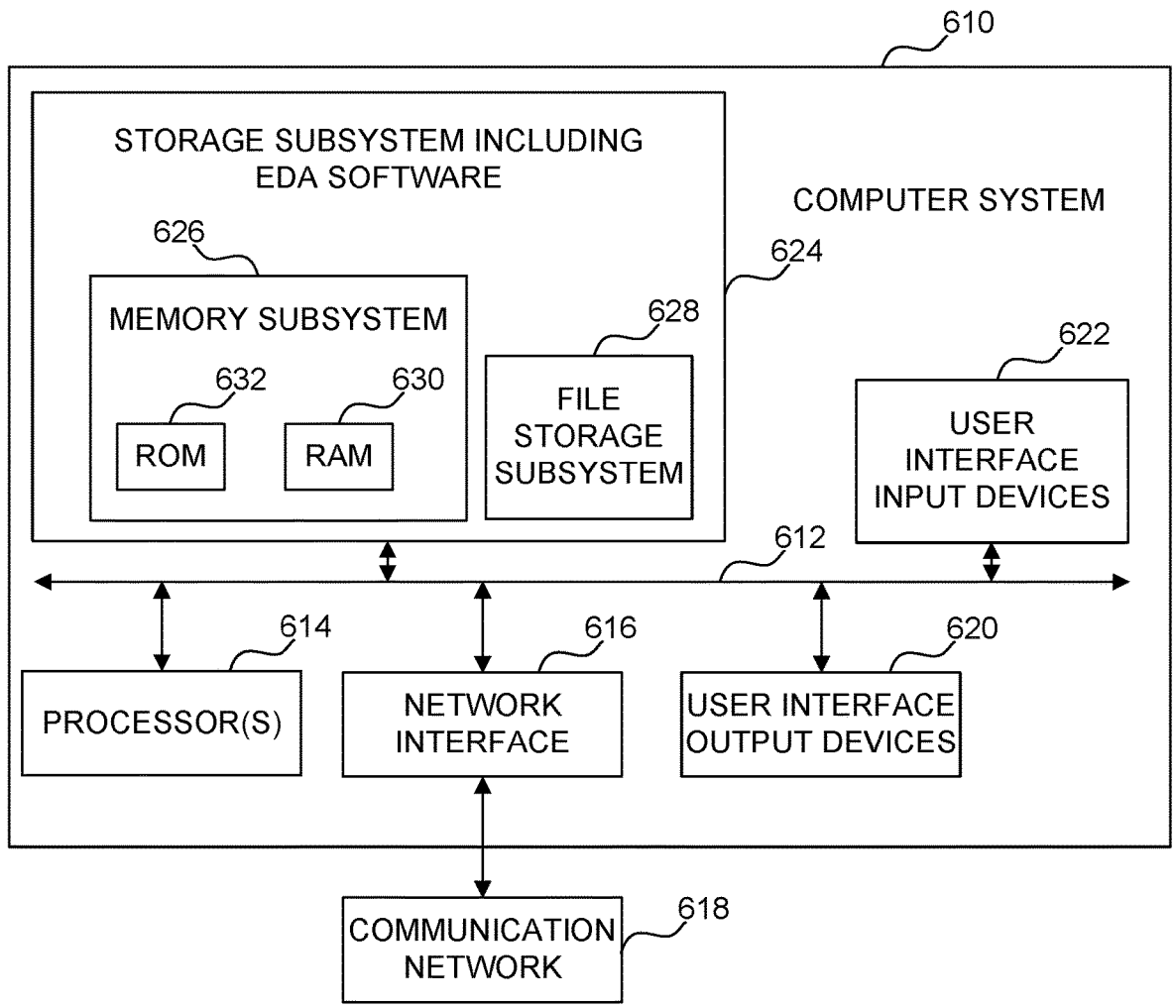
FIGS. 6A and 6B depict abstract diagrams of a computer system for use in commerce, if needed, by embodiments of the claimed inventions, as well as an embodiment of a circuit design and an embodiment of a manufactured circuit used in these claimed inventions.
Figure 6B:
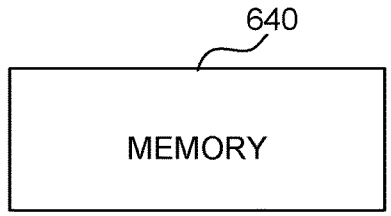

FIGS. 6A and 6B are abstract diagrams of a computer system suitable for enabling embodiments of the claimed inventions.

In FIG. 6A, the structure of computer system 610 typically includes at least one computer 614 which communicates with peripheral devices via bus subsystem 612. Typically, the computer includes a processor (e.g., a microprocessor, graphics processing unit, or digital signal processor), or its electronic processing equivalents, such as an Application Specific Integrated Circuit ('ASIC') or Field Programmable Gate Array ('FPGA'). Typically, peripheral devices include a storage subsystem 624, comprising a memory subsystem 626 and a file storage subsystem 628, user interface input devices 622, user interface output devices 620, and/or a network interface subsystem 616. The input and output devices enable direct and remote user interaction with computer system 610. The computer system enables significant post-process activity using at least one output device and/or the network interface subsystem.

The computer system can be structured as a server, a client, a workstation, a mainframe, a personal computer (PC), a tablet PC, a set-top box (STB), a personal digital assistant (PDA), a cellular telephone, a smartphone, a web appliance, a rack-mounted 'blade', a kiosk, a television, a game station, a network router, switch or bridge, or any data processing machine with instructions that specify actions to be taken by that machine. The term 'server', as used herein, refers to a computer or processor that typically performs processes for, and sends data and information to, another computer or processor.

A computer system typically is structured, in part, with at least one operating system program, such as Microsoft's Windows, Sun Microsystems's Solaris, Apple Computer's MacOs and iOS, Google's Android, Linux and/or Unix. The computer system typically includes a Basic Input/Output System (BIOS) and processor firmware. The operating system, BIOS and firmware are used by the processor to structure and control any subsystems and interfaces connected to the processor. Typical processors that enable these operating systems include: the Pentium, Itanium and Xeon processors from Intel; the Opteron and Athlon processors from Advanced Micro Devices; the Graviton processor from Amazon; the POWER processor from IBM; the SPARC processor from Oracle; and the ARM processor from ARM Holdings.

The claimed inventions and their embodiments are limited neither to an electronic digital logic computer structured with programs nor to an electronically programmable device. For example, the claimed inventions can use an optical computer, a quantum computer, an analog computer, or the like. Further, where only a single computer system or a single machine is signified, the use of a singular form of such terms also can signify any structure of computer systems or machines that individually or jointly use processes. Due to the ever-changing nature of computers and networks, the description of computer system 610 depicted in FIG. 6A is intended only as an example. Many other structures of computer system 610 have more or less components than the computer system depicted in FIG. 6A.

Network interface subsystem 616 provides an interface to outside networks, including an interface to communication network 618, and is coupled via communication network 618 to corresponding interface devices in other computer systems or machines. Communication network 618 can comprise many interconnected computer systems, machines and physical communication connections (signified by 'links'). These communication links can be wireline links, optical links, wireless links (e.g., using the WiFi or Bluetooth protocols), or any other physical devices for communication of information. Communication network 618 can be any suitable computer network, for example a wide area network such as the Internet, and/or a local-to-wide area network such as Ethernet. The communication network is wired and/or wireless, and many communication networks use encryption and decryption processes, such as is available with a virtual private network. The communication network uses one or more communications interfaces, which receive data from, and transmit data to, other systems. Embodiments of communications interfaces typically include an Ethernet card, a modem (e.g., telephone, satellite, cable, or ISDN), (asynchronous) digital subscriber line (DSL) unit, Firewire interface, USB interface, and the like. Communication algorithms ('protocols') can be specified using one or communication languages, such as HTTP, TCP/IP, RTP/RTSP, IPX and/or UDP.

User interface input devices 622 can include an alphanumeric keyboard, a keypad, pointing devices such as a mouse, trackball, toggle switch, touchpad, stylus, a graphics tablet, an optical scanner such as a bar code reader, touchscreen electronics for a display device, audio input devices such as voice recognition systems or microphones, eye-gaze recognition, brainwave pattern recognition, optical character recognition systems, and other types of input devices. Such devices are connected by wire or wirelessly to a computer system. Typically, the term 'input device' signifies all possible types of devices and processes to transfer data and information into computer system 610 or onto communication network 618. User interface input devices typically enable a user to select objects, icons, text and the like that appear on some types of user interface output devices, for example, a display subsystem.

User interface output devices 620 can include a display subsystem, a printer, a fax machine, or a non-visual communication device such as audio and haptic devices. The display subsystem can include a cathode ray tube (CRT), a flat-panel device such as a liquid crystal display (LCD), an image projection device, or some other device for creating visible stimuli such as a virtual reality system. The display subsystem also can provide non-visual stimuli such as via audio output, aroma generation, or tactile/haptic output (e.g., vibrations and forces) devices. Typically, the term 'output device' signifies all possible types of devices and processes to transfer data and information out of computer system 610 to the user or to another machine or computer system. Such devices are connected by wire or wirelessly to a computer system. Note: some devices transfer data and information both into and out of the computer, for example, haptic devices that generate vibrations and forces on the hand of a user while also incorporating sensors to measure the location and movement of the hand. Technical applications of the sciences of ergonomics and semiotics are used to improve the efficiency of user interactions with any processes and computers disclosed herein, such as any interactions with regards to the design and manufacture of circuits, that use any of the above input or output devices.

Memory subsystem 626 typically includes a number of memories including a main random-access memory ('RAM') 630 (or other volatile storage device) for storage of instructions and data during program execution and a read only memory ('ROM') 632 in which fixed instructions are stored. File storage subsystem 628 provides persistent storage for program and data files, and can include a hard disk drive, a floppy disk drive along with associated removable media, a CD-ROM drive, an optical drive, a flash memory such as a USB drive, or removable media cartridges. If computer system 610 includes an input device that performs optical character recognition, then text and symbols printed on paper can be used as a device for storage of program and data files. The databases and modules used by some embodiments can be stored by file storage subsystem 628.

Bus subsystem 612 provides a device for transmitting data and information between the various components and subsystems of computer system 610. Although bus subsystem 612 is depicted as a single bus, alternative embodiments of the bus subsystem can use multiple busses. For example, a main memory using RAM can communicate directly with file storage systems using Direct Memory Access ('DMA') systems.

FIG. 6B depicts a memory 640 such as a non-transitory, processor readable data and information storage medium associated with file storage subsystem 628, and/or with network interface subsystem 616, and can include a data structure specifying a circuit design. The memory 640 can be a hard disk, a floppy disk, a CD-ROM, an optical medium, removable media cartridge, or any other medium that stores computer readable data in a volatile or nonvolatile form, such as text and symbols on paper that can be processed by an optical character recognition system. A program transferred in to and out of a processor from such a memory can be transformed into a physical signal that is propagated through a medium (such as a network, connector, wire, or circuit trace as an electrical pulse); or through a medium such as space or an atmosphere as an acoustic signal, or as electromagnetic radiation with wavelengths in the electromagnetic spectrum longer than infrared light).

Detailed Description—Technology Support EDA System/Workflow Explanation

Figure 5:
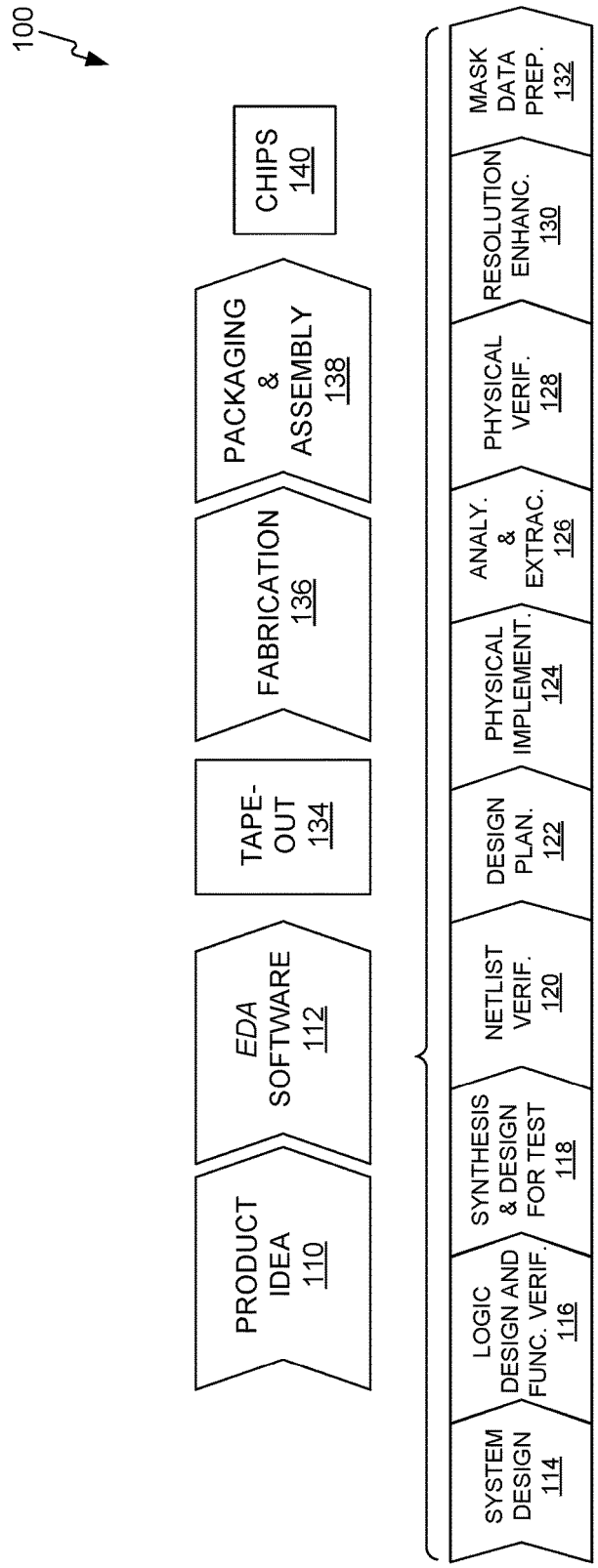
FIG. 5 depicts a flowchart of various processes used during the design and manufacture of an integrated circuit.

FIG. 5 depicts a set of processes 5-100 used during the design, verification and fabrication of an article of manufacture such as an integrated circuit to transform and verify design data and instructions that represent the integrated circuit. Each of these processes can be structured and enabled as multiple modules. The term 'EDA' signifies the term 'Electronic Design Automation'. These processes start with the creation of a product idea 5-110 with information supplied by a designer, information which is transformed to create an article of manufacture that uses a set of EDA processes 5-112. When the design is finalized, it is taped-out 5-134, which typically is when artwork (e.g., geometric patterns) for the integrated circuit is sent to a fabrication facility to manufacture the mask set, which is then used to manufacture the integrated circuit. After tape-out, a semiconductor die is manufactured 5-136 and packaging and assembly processes 5-138 are performed to produce the finished integrated circuit 5-140.

Specifications for a circuit or electronic structure are as used in commerce at multiple levels of useful abstraction ranging from low-level transistor material layouts to high-level description languages. Most designers start with a description using one or more modules with less detail at a high-level of abstraction to design their circuits and systems, using a hardware description language ('HDL') such as VHDL, Verilog, SystemVerilog, SystemC, MyHDL or OpenVera. The high-level description is easier for designers to understand, especially for a vast system, and can describe very complex systems that are difficult to understand using a lower level of abstraction that is a more detailed description. The HDL description can be transformed into other levels of abstraction that are used by the developers. For example, a high-level description can be transformed to a logic-level register transfer level ('RTL') description, a gate-level description, a layout-level description, or a mask-level description. Each lower abstraction level that is a less abstract description adds more useful detail into the design description, for example, more details for the modules that comprise the description. The lower-levels of abstraction that are less abstract descriptions can be generated by a computer, derived from a design library, or created by another design automation process. An example of a specification language at a lower level of abstraction language for specifying more detailed descriptions is SPICE, which is much used for detailed descriptions of circuits with many analog components. A circuit specification for a circuit also has value as an article of manufacture in commerce as a good under the Uniform Commercial Code (see U.C.C. Article 2, Part 1). Descriptions at each level of abstraction are enabled for use by the corresponding tools of that layer (for example, a formal verification tool), and some of the modules of the abstractions need not be novel or unobvious.

A design process that uses EDA processes 5-112 includes processes 5-114 to 5-132, which are described below. This design flow description is used only to illustrate, not to limit. For example, a designer of an integrated circuit design can use the design processes in a different sequence than the sequence depicted in FIG. 5. For the embodiments disclosed herein, products from Synopsys, Inc. of Mountain View, Calif. (hereinafter signified by 'Synopsys'), are used to enable these processes, and/or similar products from other companies.

During system design 5-114, a designer specifies the functionality to be manufactured. The designer also can optimize the power, performance and area (physical and/or lines of code) and minimize costs, etc. Partitioning of the design into different types of modules can occur at this stage. Exemplary EDA products from Synopsys that enable system design 5-114 include: the Model Architect, Saber, System Studio, and Designware products.

During logic design and functional verification 5-116, modules in the circuit are specified in one or more description languages, and the specification is checked for functional accuracy, that is, that the modules produce outputs that match the requirements of the specification of the circuit or system being designed. Exemplary HDL languages are Verilog, VHDL and SystemC. Functional verification typically uses simulators and other programs such as testbench generators, static HDL checkers and formal verifiers. In some situations, special systems of modules referred to as 'emulators' or 'prototyping systems' are used to speed up the functional verification. Exemplary EDA products from Synopsys that can be used at this stage include: VCS, Vera, Designware, Magellan, Formality, ESP and Leda products. Exemplary emulator and prototyping products available from Synopsys that enable logic design and functional verification 5-116 include: Zebu® and Protolink® (® signifies 'Registered Trademark').

During synthesis and design for test 5-118, HDL code is transformed to a netlist (which typically is a graph structure where the edges represent components of a circuit and where the nodes represent how the components are interconnected). Both the HDL code and the netlist are hierarchical articles of manufacture that can be used by an EDA product to verify that the integrated circuit, when manufactured, performs according to its design. This netlist can be optimized for a target semiconductor manufacturing technology. Additionally, the finished integrated circuit is tested to verify that it satisfies the requirements of the specification. Exemplary EDA products from Synopsys that enable synthesis and design for test 5-118 include: the Design Compiler, Physical Compiler, Test Compiler, Power Compiler, FPGA Compiler, Tetramax, and Designware products.

During netlist verification 5-120, the netlist is checked for compliance with timing constraints and for correspondence with the HDL code. Exemplary EDA products from Synopsys that enable netlist verification 5-120 include: the Formality, Primetime, and VCS products.

During design planning 5-122, an overall floor plan for the integrated circuit is constructed and analyzed for timing and top-level routing. Exemplary EDA products from Synopsys that enable design planning 5-122 include: the Astro and IC Compiler products.

During layout implementation 5-124, physical placement (positioning of circuit components such as transistors or capacitors) and routing (connection of the components by multiple conductors) occurs, and the selection of cells from a library to enable specific logic functions. As used herein, the term 'cell' signifies a set of transistors, other components, and interconnections that provides a Boolean logic function (e.g., AND, OR, NOT, XOR) or a storage function (such as a flipflop or latch). As used herein, a circuit 'block' comprises two or more cells. Both a cell and a circuit block can be referred to as a module, and are enabled as both physical structures and in simulations. Parameters are specified for selected cells (based on 'standard cells') such as size, and made accessible in a database for use by EDA products. Examples of databases that can be used for accessing cells include MySQL and PostgreSQL. Exemplary EDA products from Synopsys that enable layout implementation 5-124 include: the Astro and IC Compiler products.

During analysis and extraction 5-126, the circuit function is verified at the layout level, which permits refinement of the layout design. Exemplary EDA products from Synopsys that enable analysis and extraction 5-126 include: the Astrorail, Primerail, Primetime, and Star RC/XT products.

During physical verification 5-128, the layout design is checked to ensure that manufacturing constraints are correct, such as DRC constraints, electrical constraints, lithographic constraints, and that circuitry function matches the HDL design specification. Exemplary EDA products from Synopsys that enable physical verification 5-128 include: the Hercules product.

During resolution enhancement 5-130, the geometry of the layout is transformed to improve how the design is manufactured. Exemplary EDA products from Synopsys that enable resolution enhancement 5-130 include: the *Proteus* product.

During tape-out, data is created to be used (after lithographic enhancements are applied if appropriate) for production of lithography masks. Example EDA products from Synopsys that enable tape-out include: the IC Compiler and Custom Designer products.

During mask-data preparation 5-132, the 'tape-out' data is used to produce lithography masks that are used to produce finished integrated circuits. Exemplary EDA products from Synopsys that enable mask-data preparation 5-132 include: the CATS family of products.

For all of the abovementioned EDA products, similar products from other EDA vendors, such as Cadence, Siemens, other corporate entities or various non-commercial products from universities, or open source repositories, can be used as an alternative.

A storage subsystem of a computer system (such as computer system 610 of FIG. 6A) is preferably used to store the programs and data structures that are used by some or all of the EDA products described herein, and products used for development of cells for the library and for physical and logical design that use the library.

Detailed Description—Semantic Support

The signifier 'commercial solution' signifies, solely for the following paragraph, an engineering domain-specific (and thus non-preemptive—see Bilski): electronic structure, a process for a specified machine, a manufacturable circuit (and their Church-Turing equivalents) or a composition of matter that applies science and/or technology for use in commerce to solve a technical problem.

The signifier 'abstract' (when used in a patent claim for any enabled embodiments disclosed herein for a new commercial solution that is a scientific use of one or more laws of nature {see Benson}, and that solves a problem of technology {see Diehr} for use in commerce—or improves upon an existing solution used in commerce {see Diehr})— is precisely defined by the inventor(s) {see MPEP 2111.01 (9$^{th}$ edition, Rev. August 2017)} as follows:

a) a new commercial solution is 'abstract' if it is not novel (e.g., it is so well known in equal prior art {see Alice} and/or the use of equivalent prior art solutions is long prevalent {see Bilski} in science, engineering or commerce), and thus unpatentable under 35 U.S.C. 102, for example, because it is 'difficult to understand' {see Merriam-Webster definition for 'abstract'} how the commercial solution differs from equivalent prior art solutions; or b) a new commercial solution is 'abstract' if the existing prior art includes at least one analogous prior art solution {see KSR}, or the existing prior art includes at least two prior art publications that can be combined {see Alice} by a skilled person {often referred to as a 'PHOSITA', see MPEP 2141-2144 (9$^{th}$ edition, Rev. August 2017)} to be equivalent to the new commercial solution, and is thus unpatentable under 35 U.S.C. 103, for example, because it is 'difficult to understand' how the new commercial solution differs from a PHOSITA-combination/-application of the existing prior art; or c) a new commercial solution is 'abstract' if it is not disclosed with a description that enables its praxis, either because insufficient guidance exists in the description, or because only a generic implementation is described {see Mayo} with unspecified components, parameters or functionality, so that a PHOSITA is unable to instantiate an embodiment of the new solution for use in commerce, without, for example, requiring special programming {see Katz} (or, e.g., circuit design) to be performed by the PHOSITA, and is thus unpatentable under 35 U.S.C. 112, for example, because it is 'difficult to understand' how to use in commerce any embodiment of the new commercial solution.

Detailed Description—Definitions

As used herein, the semiotic function RUD(t,p1,p2, . . . ) signifies that a skilled person can obtain, if needed for progressing the useful arts, a reasonably useful definition of the signifier 't' that comprises the union of definitions of T in one or more U.S. Patents and U.S. Patent Applications 'p1', 'p2', etc. For example, 'RUD(substantially,9532624)' signifies that a skilled person can obtain a reasonably useful definition of 'substantially' as it is defined in U.S. Pat. No. 9,532,624.

DEFINITIONS: RUD(substantially,9532624).

Detailed Description—Conclusion

The Detailed Description signifies in isolation the individual features, structures, functions, or characteristics described herein and any combination of two or more such features, structures, functions or characteristics, to the extent that such features, structures, functions or characteristics or combinations thereof are enabled by the Detailed Description as a whole in light of the knowledge and understanding of a skilled person, irrespective of whether such features, structures, functions or characteristics, or combinations thereof, solve any problems disclosed herein, and without limitation to the scope of the Claims of the patent. When an embodiment of a claimed invention comprises a particular feature, structure, function or characteristic, it is within the knowledge and understanding of a skilled person to use such feature, structure, function, or characteristic in connection with other embodiments whether or not explicitly described, for example, as a substitute for another feature, structure, function or characteristic.

In view of the Detailed Description, a skilled person will understand that many variations of the claimed inventions can be enabled, such as function and structure of elements, described herein while remaining in the domain of the claimed inventions. One or more elements of an embodiment can be substituted for one or more elements in another embodiment, as will be understood by a skilled person.

Writings about embodiments signify their uses in commerce, thereby enabling other skilled people to similarly use in commerce.

This Detailed Description is fitly written to provide knowledge and understanding. It is neither exhaustive nor limiting of the precise structures described, but is to be accorded the widest scope consistent with the disclosed principles and features. A skilled person can enable many equivalent variations. Without limitation, any and all equivalents described, signified or Incorporated By Reference in this patent application are specifically Incorporated By Reference into the Detailed Description. In addition, any and all variations described, signified or Incorporated By Reference with respect to any one claimed invention and its embodiment also are included with all other claimed inventions and their embodiments. Any such variations include both currently known variations as well as future variations, for example any element used for enablement includes a future equivalent element that provides the same function, regardless of the structure of the future equivalent element.

It is intended that the domain of the set of claimed inventions and their embodiments be defined and judged by the following Claims and their equivalents. The Detailed Description includes the following Claims, with each Claim standing on its own as a separate claimed invention. The embodiments of the claimed inventions can have more structure and features than are explicitly specified in the Claims.

What is claimed:

1. A computerized system for detection of an error in a memory device, the computerized system comprising:
    a memory configured to store operations;
    one or more processors configured to perform the operations, the operations comprising:
        receiving, memory scrambling information comprising address scrambling information and data scrambling information;
        determining an error correction code for at least one address segment of a plurality of address segments corresponding to one or more address groupings of a plurality of address groupings, wherein the at least one address segment is determined based on the address scrambling information, wherein the error correction code for the at least one address segment comprises one or more address check bits;
        determining an error correction code for at least one data segment of a plurality of data segments corresponding to one or more data groupings of a plurality of data groupings, wherein the at least one data segment is determined based on the data scrambling information, wherein the error correction code for the at least one data segment comprises one or more data check bits;
        performing error detection corresponding to one or more bits of the at least one address segment using the error correction code for the at least one address segment; and
        performing error detection corresponding to one or more data bits of the at least one data segment using the error correction code for the at least one data segment, wherein a plurality of address bus bits, a plurality of data bits, the one or more data check bits, and the one or more address check bits are physically separated from each other based on the memory scrambling information.

2. The computerized system of claim 1, wherein the operations further comprise:
    based on the address scrambling information, determining physical proximity of one or more address bus bits from another address bus bit of the plurality of address bus bits; and
    determining an association of input address bits of a decoder with the one or more address bus bits.

3. The computerized system of claim 1, wherein the address scrambling information comprises one or more of: structural properties of a row decoder, structural properties of a column decoder, structural properties of cascaded decoders, and wire proximities.

4. The computerized system of claim 1, wherein the operations further comprise:
    generating placement to maximize physical distance between two bits of the error correction code for the at least one address segment or the error correction code for the at least one data segment based on a multi-bit upset size requirement received via a user interface.

5. The computerized system of claim 1, wherein the error correction code for the at least one address segment or the error correction code for the at least one data segment is a single bit error detection code.

6. The computerized system of claim 5, wherein the single bit error detection code comprises one of: Hamming code, an even parity bit, an odd parity bit, and a cyclic redundancy check.

7. The computerized system of claim 1, wherein the data scrambling information comprises at least one of: Input-Output (IO) cell scrambling, column scrambling, column twisting, and a strap distribution.

8. A method for detection of an error in a memory device, the method comprising:
    receiving memory scrambling information comprising address scrambling information and data scrambling information;
    determining an error correction code for at least one address segment of a plurality of address segments corresponding to one or more address groupings of a plurality of address groupings, wherein the at least one address segment is determined based on the address scrambling information, wherein the error correction code for the at least one address segment comprises one or more address check bits;
    determining an error correction code for at least one data segment of a plurality of data segments corresponding to one or more data groupings of a plurality of data groupings, wherein the at least one data segment is determined based on the data scrambling information, wherein the error correction code for the at least one data segment comprises one or more data check bits;
    performing error detection corresponding to one or more bits of the at least one address segment using the error correction code for the at least one address segment; and
    performing error detection corresponding to one or more data bits of the at least one data segment using the error correction code for the at least one data segment,
    wherein a plurality of address bus bits, a plurality of data bits, the one or more data check bits, and the one or more address check bits are physically separated from each other based on the memory scrambling information.

9. The method of claim 8, further comprising:
    based on the address scrambling information, determining physical proximity of one or more address bus bits from another address bus bit of the plurality of address bus bits; and determining an association of input address bits of a decoder with the one or more address bus bits.

10. The method of claim 8, wherein the address scrambling information comprises one or more of: structural properties of a row decoder, structural properties of a column decoder, structural properties of cascaded decoders, and wire proximities.

11. The method of claim 8, wherein the data scrambling information comprises at least one of: Input-Output (IO) cell scrambling, column scrambling, column twisting, and a strap distribution.

12. The method of claim 8, further comprising:
generating placement to maximize physical distance between two bits of the error correction code for the at least one address segment or the error correction code for the at least one data segment based on a multi-bit upset size requirement.

13. The method of claim 8, wherein the error correction code for the at least one address segment or the error correction code for the at least one data segment is a single bit error detection code.

14. The method of claim 13, wherein the single bit error detection code comprises one of: Hamming code, an even parity bit, an odd parity bit, and a cyclic redundancy check.

15. A non-transitory, tangible computer-readable device having instructions stored thereon that, when executed by at least one computing device, cause the at least one computing device to perform operations comprising:
receiving memory scrambling information comprising address scrambling information and data scrambling information;
determining an error correction code for at least one address segment of a plurality of address segments corresponding to one or more address groupings of a plurality of address groupings, wherein the at least one address segment is determined based on the address scrambling information, wherein the error correction code for the at least one address segment comprises one or more address check bits;
determining an error correction code for at least one data segment of a plurality of data segments corresponding to one or more data groupings of a plurality of data groupings, wherein the at least one data segment is determined based on the data scrambling information, wherein the error correction code for the at least one data segment comprises one or more data check bits;
performing error detection corresponding to one or more bits of the at least one address segment using the error correction code for the at least one address segment; and
performing error detection corresponding to one or more data bits of the at least one data segment using the error correction code for the at least one data segment,
wherein a plurality of address bus bits, a plurality of data bits, a one or more data check bits, and the one or more address check bits are physically separated from each other based on the memory scrambling information.

16. The non-transitory, tangible computer-readable device of claim 15, wherein the operations further comprise:
based on the address scrambling information, determining physical proximity of one or more address bus bits from another address bus bit of the plurality of address bus bits; and
determining an association of input address bits of a decoder with the one or more address bus bits.

17. The non-transitory, tangible computer-readable device of claim 15, wherein the address scrambling information comprises one or more of: structural properties of a row decoder, structural properties of a column decoder, structural properties of cascaded decoders, and wire proximities; and
wherein the data scrambling information comprises one or more of: Input-Output (IO) cell scrambling, column scrambling, column twisting, and a strap distribution.

18. The non-transitory, tangible computer-readable device of claim 15, wherein the operations further comprise:
generating placement to maximize physical distance between two bits of the error correction code for the at least one address segment or the error correction code for the at least one data segment based on a multi-bit upset size requirement.

19. The non-transitory, tangible computer-readable device of claim 15, wherein the error correction code for the at least one address segment or the error correction code for the at least one data segment is a single bit error detection code.

20. The non-transitory, tangible computer-readable device of claim 19, wherein the single bit error detection code comprises one of: Hamming code, an even parity bit, an odd parity bit, and a cyclic redundancy check.

* * * * *